(12) United States Patent
Stark et al.

(10) Patent No.: US 6,987,823 B1
(45) Date of Patent: Jan. 17, 2006

(54) SYSTEM AND METHOD FOR ALIGNING INTERNAL TRANSMIT AND RECEIVE CLOCKS

(75) Inventors: Donald C. Stark, Los Altos Hills, CA (US); Jun Kim, Redwood City, CA (US); Stefanos Sidiropoulos, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/499,025

(22) Filed: Feb. 7, 2000

(51) Int. Cl.
*H04L 7/00* (2006.01)

(52) U.S. Cl. .................. 375/354; 370/503; 327/141
(58) Field of Classification Search ............. 375/354, 375/371, 356, 358, 375; 370/503, 516, 517; 327/141, 144, 146
See application file for complete search history.

(56) References Cited

U.S. PATENT DOCUMENTS

| | | | | |
|---|---|---|---|---|
| 4,694,472 A | * | 9/1987 | Torok et al. | 375/354 |
| 5,432,823 A | * | 7/1995 | Gasbarro et al. | 375/356 |
| 5,953,286 A | * | 9/1999 | Matsubara et al. | 365/233 |
| 6,289,068 B1 | * | 9/2001 | Hassoun et al. | 375/376 |
| 6,426,984 B1 | * | 7/2002 | Perino et al. | 375/356 |
| 6,469,699 B2 | * | 10/2002 | Yoshine | 345/206 |
| 6,487,648 B1 | * | 11/2002 | Hassoun | 711/167 |
| 2001/0033630 A1 | * | 10/2001 | Hassoun et al. | 375/376 |

* cited by examiner

*Primary Examiner*—Jean B. Corrielus
(74) *Attorney, Agent, or Firm*—Morgan, Lewis & Bockius LLP

(57) ABSTRACT

A circuit defining a second system clock in a system comprising a master connected to one or more slave devices via a channel, the channel communicating an externally generated first system clock towards the master. The circuit comprising a delay locked loop circuit configured to receive the first system clock and a second phase feedback signal as inputs and to generate a transmit clock signal. A 90 degrees block configured to receive the transmit system clock and to generate a 90 degrees phased shifted version of the transmit clock signal. An output driver circuit configured to receive the 90 degrees phased shifted version of the transmit clock signal and to generate the second system clock. A first phase detector configured to receive a receive system clock and the transmit system clock and to generate a first phase feedback signal. A delay element configured to receive the first system clock and the first phase feedback signal and to generate a delayed first system clock. A second phase detector configured to receive the delayed first system clock and the second system clock and to generate the second phase feedback signal.

18 Claims, 13 Drawing Sheets

SYSTEM AND METHOD FOR ALIGNING INTERNAL TRANSMIT AND RECEIVE CLOCKS

BACKGROUND OF THE INVENTION

The present invention relates to a system and method for aligning two or more clock domains. More particularly, the present invention relates to a system and method for aligning transmit and receive clocks in a bus system.

FIG. 1A conceptually illustrates a bus system. The bus system generally comprises a master 3 and one or more slave devices (2a ... 2n) connected via a channel comprising a number of signal lines or buses. Typically, a bi-directional bus communicates data between master 3 and slave devices (2a ... 2n). Control information is communicated via the same or via a separate bus (not shown). Data and/or control information are communicated in relation to one or more clock signals. Master 3 is associated with an application 1. Application 1 may take many forms including a microprocessor, a memory controller, a graphics controller, etc. Application 1 may incorporate master 3 or be separately implemented.

In the example, shown in FIG. 1A, an externally generated Clock-To-Master (CTM), or first system clock signal, travels through the slave devices towards the master. At the master, CTM is turned around to form a Clock-From-Master (CFM), or second system clock signal, which travel backs through the slave devices in a direction away from the master. In contemporary bus systems, the master and/or the slave devices typically includes an interface circuit (not shown) which controls the data and control information signals communicated between the master and the slave devices.

The relationship between application 1 and master 3 is further illustrated in FIG. 1B. Master 3 typically includes one or more delay locked loop (DLL) circuit(s), or similar circuit(s), which generates a receive clock (rclk) and a transmit clock (tclk). Generally speaking, the receive clock (rclk) controls the receiver functions in master 3 and the transmit clock (tclk) controls the transmit or data output functions in master 3. Thus, rclk and tclk define separate clock domains. This concept is illustrated by the relationships between receiver 3a, output driver 3b, and DLL 4 of FIG. 1B.

The receive clock (rclk) in the master is normally aligned with the knowledge that data being sent from the slave devices is communicated in a known relationship to CTM, and that this relationship is maintained as both the data signals and CTM traverse the channel towards the master. In other words, the receive clock (rclk) is normally phase aligned in a known relationship to CTM. This relationship is designed to maximize the timing margin for sampling the data at master 3. In many contemporary bus systems, data is transmitted 90° ahead of its corresponding CTM edge. As illustrated in FIG. 2, this relationship requires that the receive clock (rclk) lag CTM by a period of time equal to the nominal setup time for the receiver ($T_{SETUP\_IR}$).

To achieve the foregoing, DLL 4 may be used. FIG. 3 illustrates an exemplary clock recovery circuit yielding the desired relationship comprising DLL 4 and flip-flop circuits (5a ... 5e). Use of the receiver in the master as a phase detector for the DLL circuit assures that rclk properly lags CTM by the period $T_{SETUP\_IR}$.

Referring to again to FIG. 1B, the transmit clock (tclk) is aligned with the knowledge that data being sent from the master to the slave devices is communicated with a known relationship to CFM, and that this relationship is maintained as both the data and CFM traverse the channel away from the master. This relationship is designed to maximize the timing margin for sampling the data at the slave devices.

In contemporary bus systems, it is common for data to be communicated 90° ahead of the corresponding CFM edge. Since there is a known, finite delay for the data traversing the output drivers in the master (output driver delay, $T_{OD}$), achieving the desired data to tclk timing relationship requires that the transmit clock (tclk) be (90°+$T_{OD}$) ahead of the corresponding CFM edge. This relationship is illustrated in FIG. 4.

A clock recovery circuit yielding the desired tclk relationships is shown in FIG. 5. Within this exemplary circuit, DLL 6 is used to align the transmit clock (tclk) which is applied to output drivers 10a, 10b ... 10n. The feedback path uses a 90° block 9 and a dummy output driver circuit 8 to achieve the desired phase relationship. A Zero degree Phase Detector (ZPD) is used to compare the feedback signal to CFM and drive DLL 6.

In addition to rclk and tclk, master 3 typically generates a third reference signal, Synclk. Synclk is used to control data exchanges between application 1 and master 3. That is, Synclk provides a reference for data signals received from the application by the master and for data signal sent from the master to the application. As illustrated in FIG. 1B, some contemporary bus systems formed Synclk by a dividing down the receiver clock (rclk).in divider circuit 3c. Thus, the timing relationships for signals being communicated between the master and the application are ultimately referenced to Synclk which in turn is a product of rclk.

Unfortunately, as suggested above, a great number of control and data signals in the master must necessarily be referenced to tclk instead of Synclk/rclk. The existence of separate tclk and rclk domains within a bus system creates a number of synchronization concerns. For example, data from the application to be transmitted by the master to one or more slave devices must first be received in the master. This application-to-master data transfer is done in accordance with Synclk. However, the data is transmitted from the master to the one or more slave devices in accordance with tclk. The transition of such data from the rclk domain to the tclk domain is accomplished by "holding" the data in the master for some defined period of time.

Following conventional theory, CFM and CTM are identical except for their propagation direction. Thus, rclk and tclk would be similarly related, but for the finite timing delays necessarily introduced by operation of the receiver and the output driver circuits.

Unfortunately, as described in greater detail below, the ideal relationship between rclk and tclk do not hold in practice. Rather, timing delays introduced by circuit operations in varying voltage and temperature condition tend to skew the phase relationship between rclk and tclk. Recognizing that the electrical circuits in issue here will vary in their response time across a range of process, operating, and environment conditions, bus system designers must necessarily expand the synchronizing "hold" time periods within the master for data to accurately transition between the rclk and the tclk domains.

The timing diagram of FIG. 6 illustrates a set of ideal phase relationships between the clock signals described above. Consistent with contemporary practice, CTM and CFM are shown as a single signal. The phase relationship of rclk is $T_{SETUP\_IR}$ behind CTM/CFM. Edge transitions for Synclk are synchronous with rclk. The phase relation of tclk is $(90°+T_{OD})$ ahead of CTM/CFM. Thus, if the delay of a clock signal through the output driver is $(90°-T_{SETUP\_IR})$, then rclk and tclk will be separated in phase by 180°. These relationships are considered ideal in the working example.

Ideal sampling points for data transmitted from the application to the master correspond to the rising edge of rclk, as indicated by letters a, b, c, and d in FIG. 6. In other words, the setup and hold requirements which the application must adhere to are referenced to these edges.

However, as practically implemented within contemporary bus systems, the actual sampling of this data occurs at the falling edges of tclk, as indicated by aa, bb, cc, and dd of FIG. 6. Where the ideal phase relationships of FIG. 6 exist, the setup and hold requirements within the master consist of merely the setup and hold time of a flip-flop circuit sampling the data shifted by the input receiver setup time. Unfortunately, the ideal phase relationships of FIG. 6 rarely exist within bus systems.

To summarize, the setup time requirement for the data can be described as:

$$T_{SETUP\_Tdata}=(T_{OD}+T_{SETUP\_IR}-90°)+T_{SETUP\_FF}, \text{ and}$$

the hold time requirement for the data can be described as:

$$T_{HOLD\_Tdata}=T_{HOLD\_FF}-(90°-T_{OD}-T_{SETUP\_IR}),$$

where $T_{SETUP\_FF}/T_{HOLD\_FF}$ are the setup and hold times for the flip-flops sampling the data signals. Further, $T_{SETUP\_Tdata}/T_{HOLD\_Tdata}$ are ideally referenced from the rising edge of rclk, and the optimal value for $T_{OD}$ is $(90°-T_{SETUP\_IR})$.

In actual implementation, however, the output driver delay $(T_{OD})$ is seldom equal to $(90°-T_{SETUP\_IR})$. In fact, the delay at the output drivers will vary with operating conditions such as voltage and temperature. As a result, the ideal phase relations shown in FIG. 6 do not exist in practice. Recognizing this result, bus system designers have been forced to adopt rather loose standards for the sampling of data at the points indicated in FIG. 6. In other words, overall system timing requirements are squeezed by the necessity to accommodate a wide range of output driver delay times. In contemporary bus systems, the resulting timing restrictions are in the order of 3 ns for setup time and 2 ns for hold time. Such restrictions are a great burden on bus systems having rclk/tclk frequencies above several hundred MHz. This is particularly true since output driver delay times tends to decrease slower than the CTM cycle times.

SUMMARY OF THE INVENTION

A method of aligning clock signals in a system includes generating a transmit clock signal in a master, and arbitrarily adjusting the phase of the transmit clock signal while maintaining a a first predefined phase relationship between the transmit clock signal and a second system clock. A further adjustment of the phase of the transmit clock signal may be made to have a a second predefined phase relationship with a receive clock signal while maintaining the first predefined phase relationship between the transmit clock signal and the second system clock. In one embodiment, the second predefined phase relationship between the transmit clock signal and the receive clock signal is 180°.

In another aspect, a method of aligning clock signals in a bus system includes generating a transmit clock signal in a master in relation to a first system clock, shifting the transmit clock signal phase by 90°, and passing the phase shifted transmit clock signal through an output driver circuit in the master to generate a second system clock. As a result and in contrast to the conventional expectation, the first and second system clocks need not be phase aligned.

DETAILED DESCRIPTION

The maximum effective operating speed for a bus system is essentially the sum of critical path timing requirements. Further, data robustness in the bus system is a product of timing margins. Timing margins are impacted by a host of timing requirements. The restrictive setup and hold requirements explained above disadvantageously impact effective operating speed and timing margins.

The present invention addresses this problem by providing a system and method in which an ideal phase relationship between tclk and rclk domains can be maintained for all output driver delays across a range of bus system operating conditions. In one aspect, the present invention utilizes a CFM driver circuit which allows for arbitrary phase adjustments of tclk while maintaining the correct phase relationship between tclk and CFM, i.e., tclk being $(90°+T_{OD})$ ahead of CFM. Thereafter, the phase of tclk may be further adjusted until it has an optimal phase relationship with rclk, i.e. tclk being separated from rclk by 180°.

Figure 7:
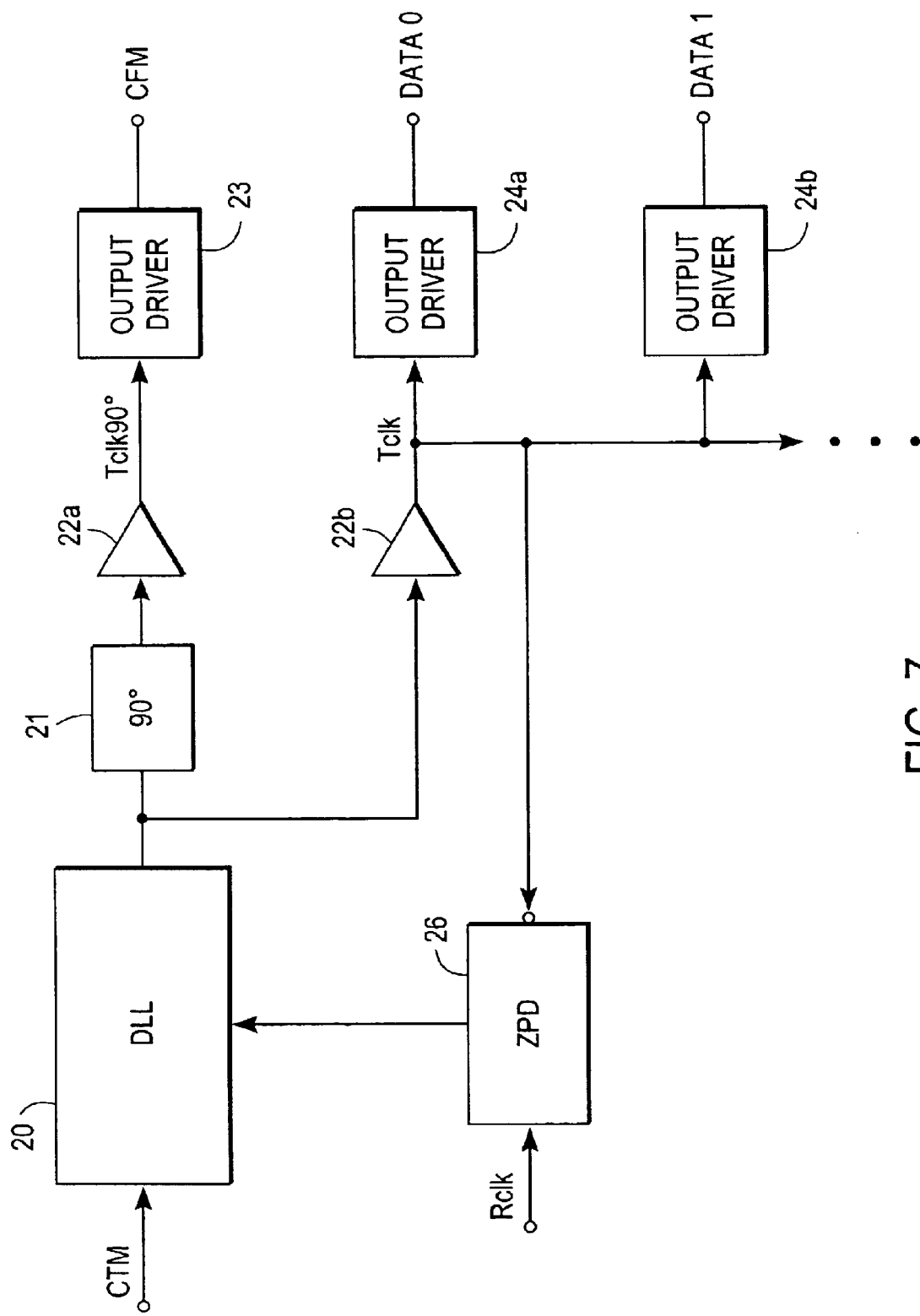
FIG. 7 is an exemplary circuit competent to provide a set of timing relationships in accordance with the present invention.

The circuit shown in FIG. 7 provides these desired phase relationships. In FIG. 7, CTM and the output of zero phase detector (ZPD) 26 are received in DLL circuit 20. The output of DLL 20 passes through 90° block 21 and buffer 22a to be output at driver 23 as CFM. That is, 90° block 21 generates a signal tclk 90° which is delayed 90° from tclk. The signal tclk 90° is then used to generate the CFM signal through a standard output driver. The sum delay from these two blocks equals 90° plus the output driver delay $(T_{OD})$.

The output of DLL 20 also passes through buffer 22b to yield tclk which is applied to the data output drivers 24a, 24b, . . . 24n corresponding to Data 0, Data 1 . . . Data n. Along with rclk, the complement of tclk is applied to ZPD 26.

The circuit shown in FIG. 7 thus generates a tclk signal ahead of CFM by (90°+$T_{OD}$). Since tclk is used to generate data signals on the channel (Data0, Data1 . . . DataN), this relationship ensures that the data is 90° ahead of CFM, thereby maximizing data margins. Finally, the circuit maintains the optimal 180° relationship between rclk and tclk.

Figure 8:
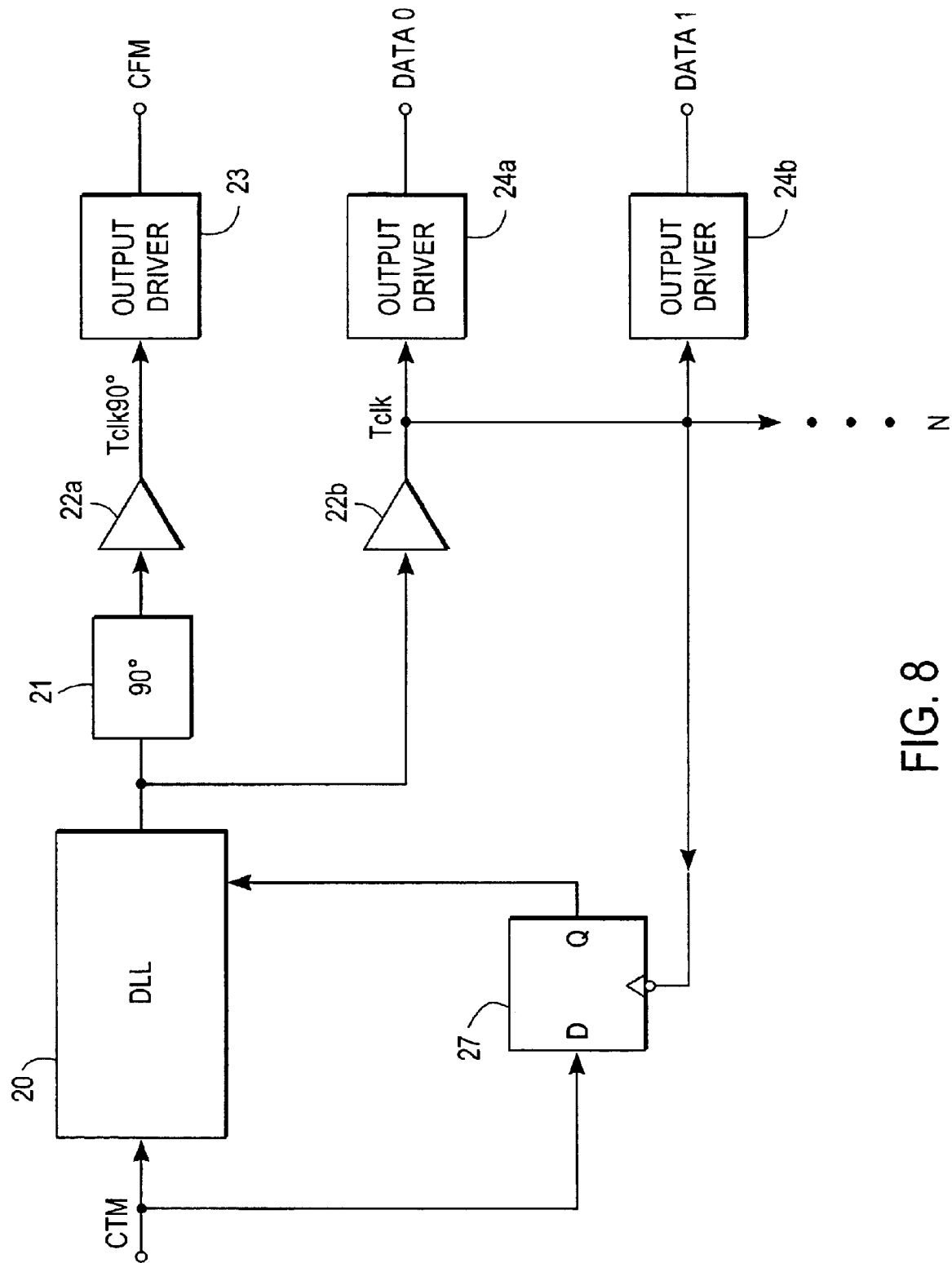
FIG. 8 is an alternative embodiment to the circuit shown in FIG. 7.

An alternative circuit is shown in FIG. 8. The alternative circuit substitutes a flip-flop circuit 27 for ZPD 26. Flip-flop 27 receives CTM as an input and the complement of tclk as a gating clock signal.

The exemplary circuits shown above may be modified to operate by using the complement of rclk, rather than tclk to control the output drivers. Since the feedback loop in the circuits above aligns tclk to the complement rclk, either signal may be used to control the transmit circuitry. Where the complement of rclk is used as the controlling signal, tclk exists merely to produce CFM.

Figure 9:
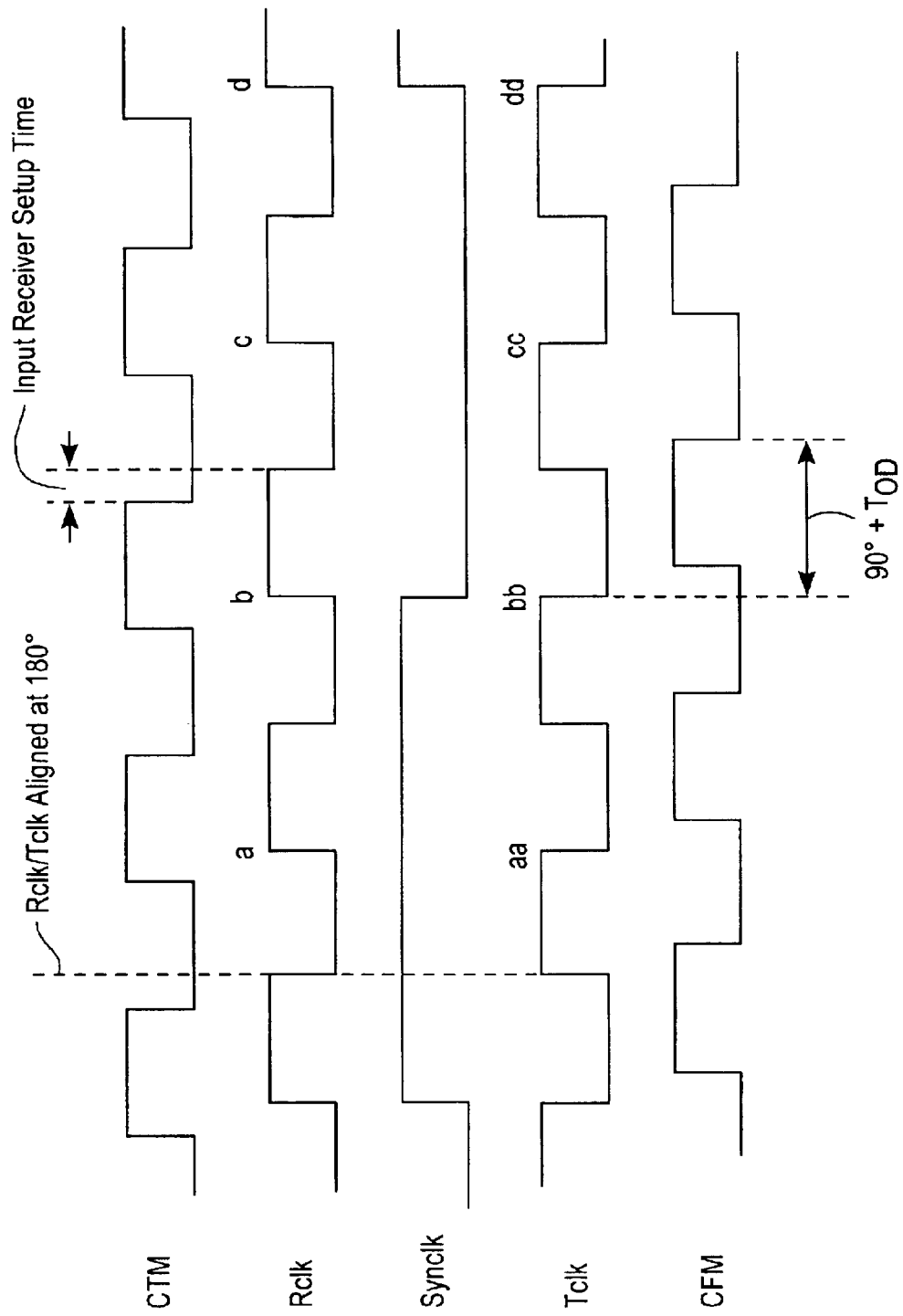
FIG. 9 is a timing diagram illustrating the resulting timing relationships of the present invention.

All of these techniques yield the clock relationships shown in FIG. 9. Of note, the phase relationship between CTM and CFM is now different as compared with the conventional phase relationship normally assigned to CTM and CFM. The phase relationship between CTM and CFM may now be expressed as:

$$CTM - CFM = 90° - (T_{OD} + T_{SETUP\_IR}),$$

where $T_{OD}$ equals the output driver delay and $T_{SETUP\_IR}$ equals the input receiver setup time. Thus, if $T_{OD} + T_{SETUP\_IR} > 90°$, then CFM trails CTM. If $T_{OD} + T_{SETUP\_IR} < 90°$, then CFM leads CTM.

Figure 1A:
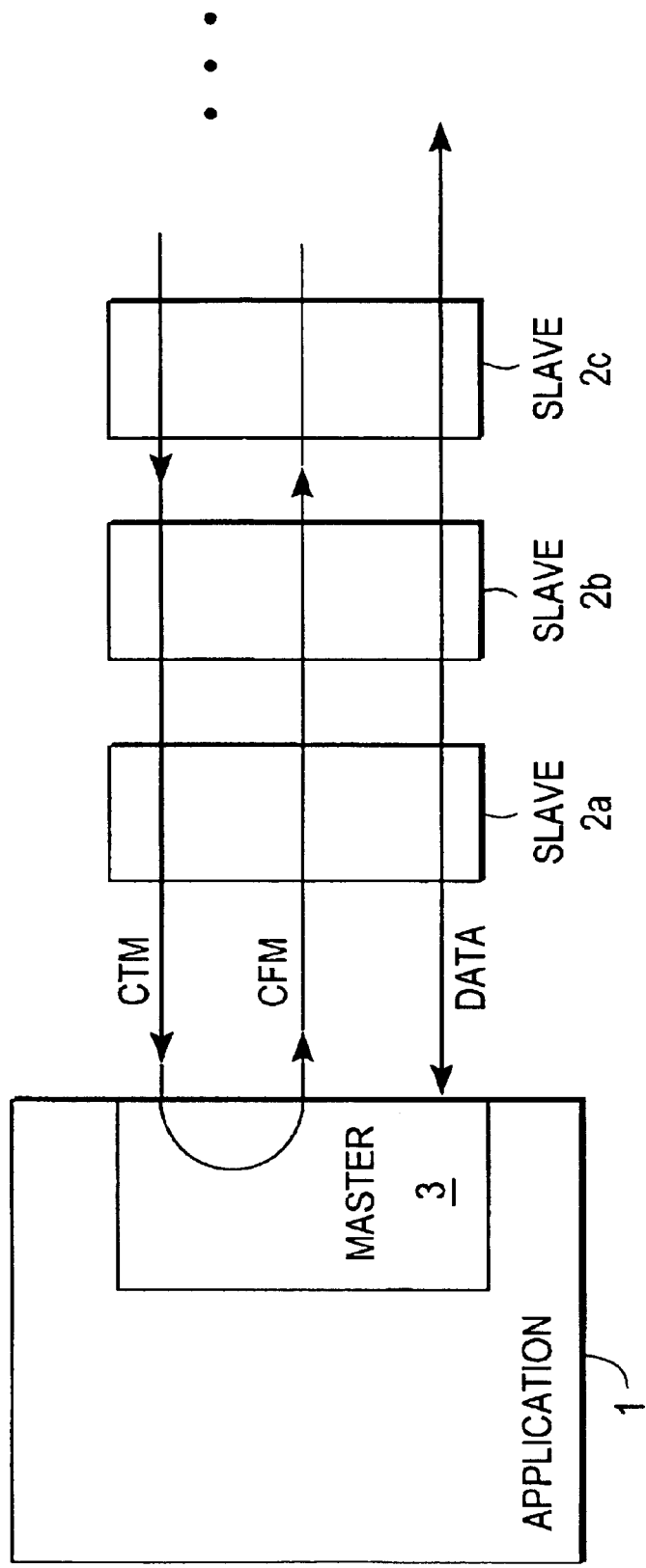
FIG. 1A is a diagram of a generalized bus system.
Figure 1B:
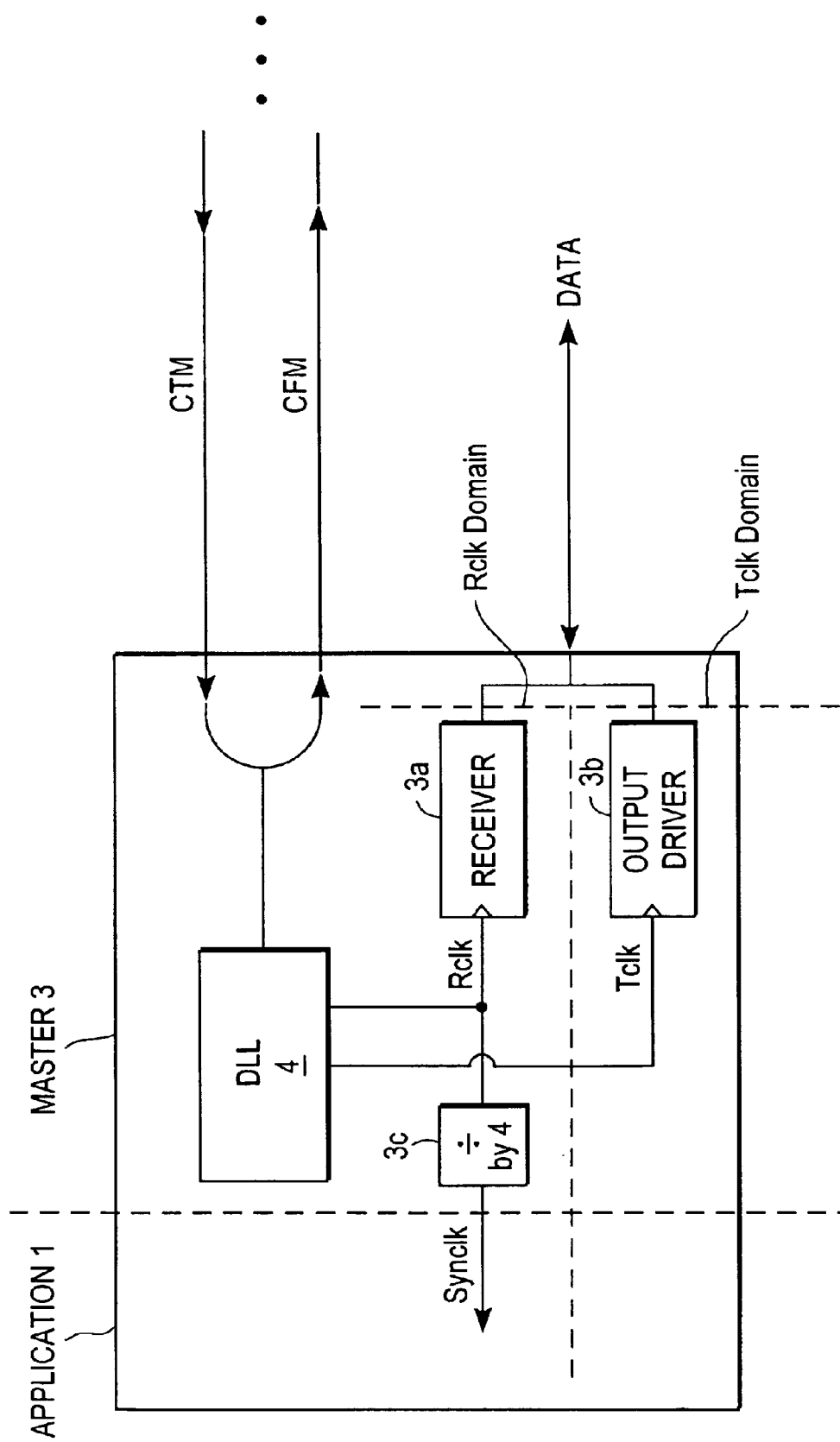
FIG. 1B is a diagram of the bus system of FIG. 1A in some additional detail.
Figure 2:
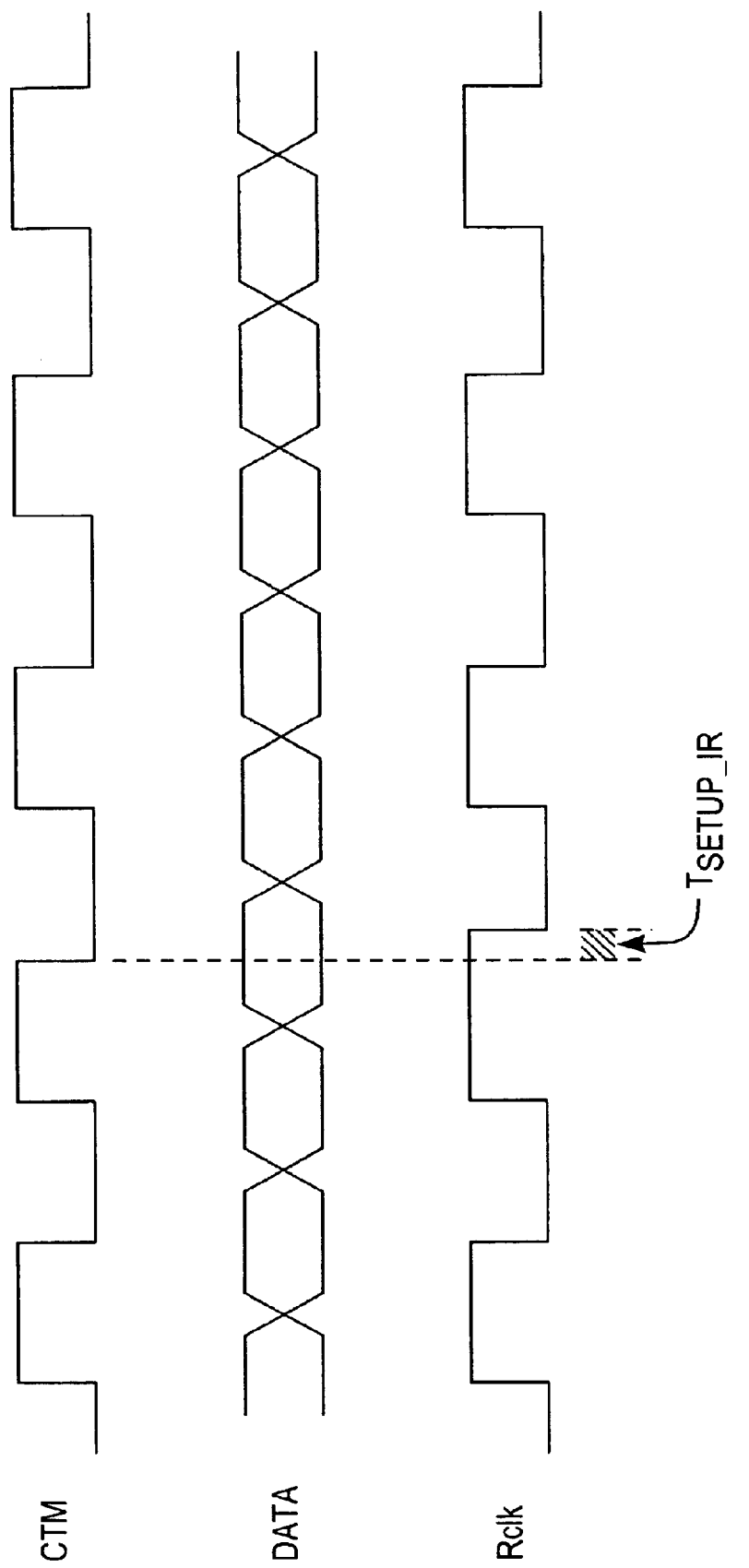
FIG. 2 is a timing diagram illustrating an ideal phase relationship between CTM and rclk.
Figure 3:
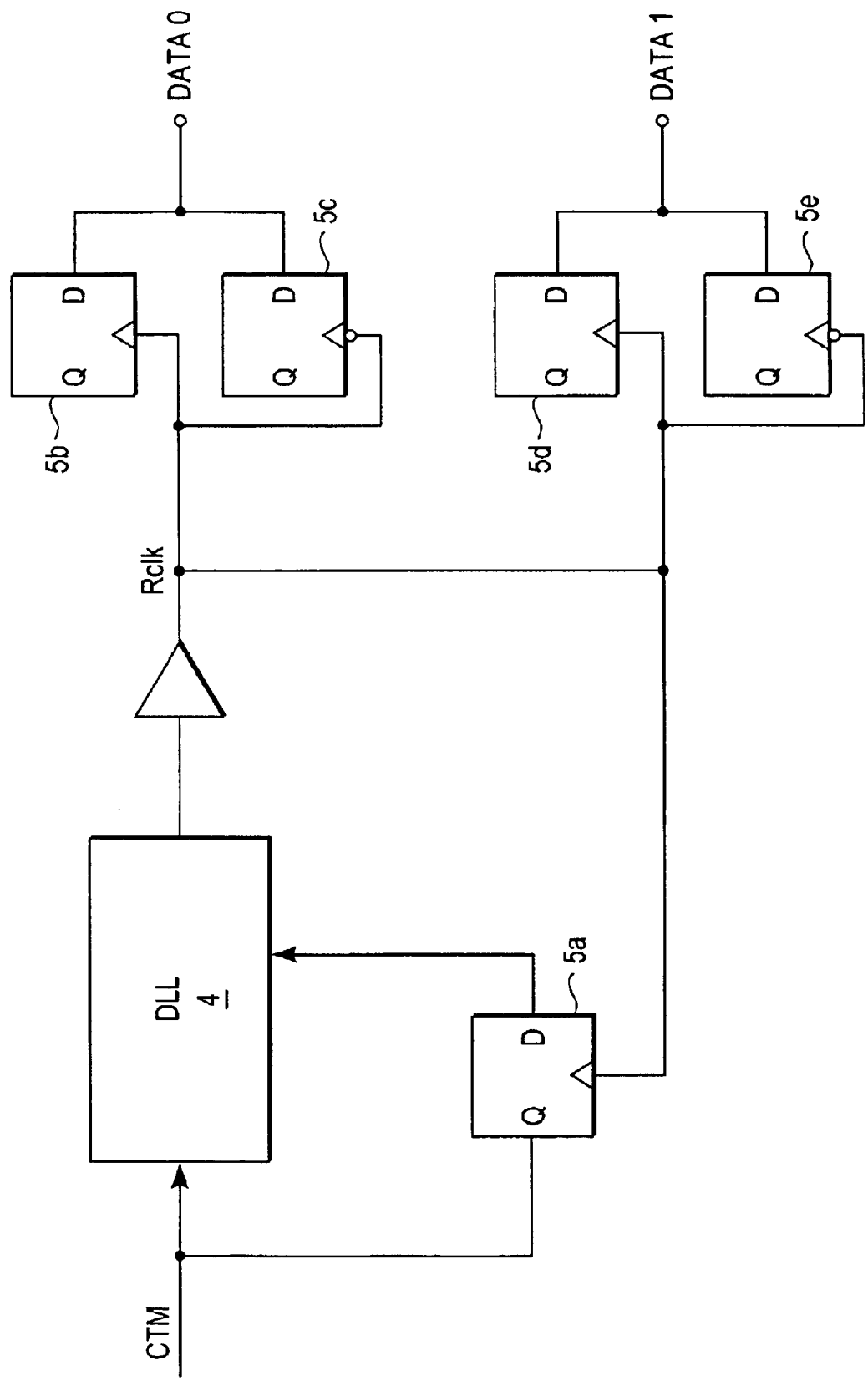
FIG. 3 is a diagram for an exemplary circuit nominally capable of implementing the timing relationship shown in FIG. 2.
Figure 4:
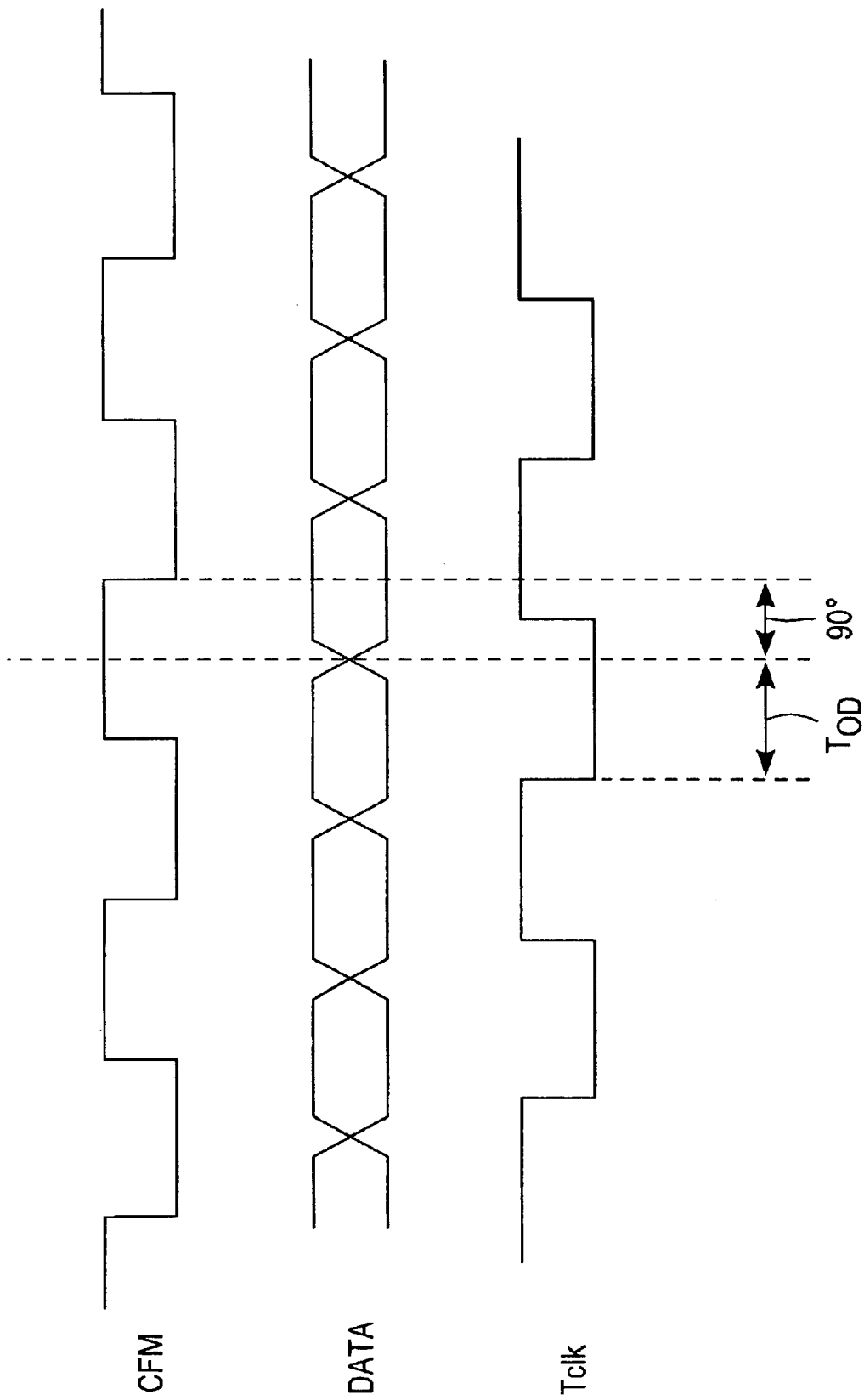
FIG. 4 is a diagram illustrating an ideal phase relationship between CFM and tclk.
Figure 5:
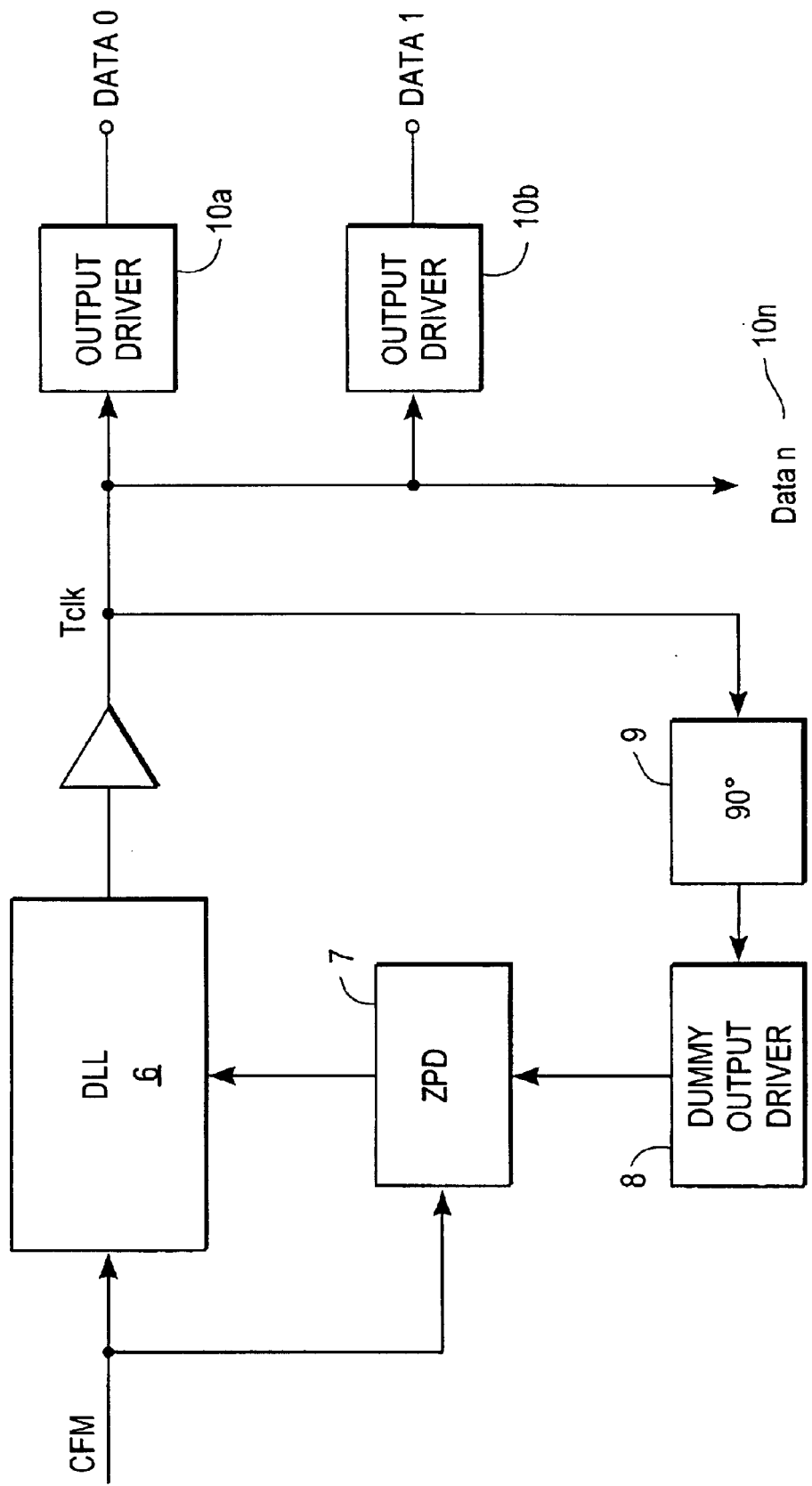
FIG. 5 is a diagram for an exemplary circuit nominally capable of implementing the timing relationship shown in FIG. 4.
Figure 6:
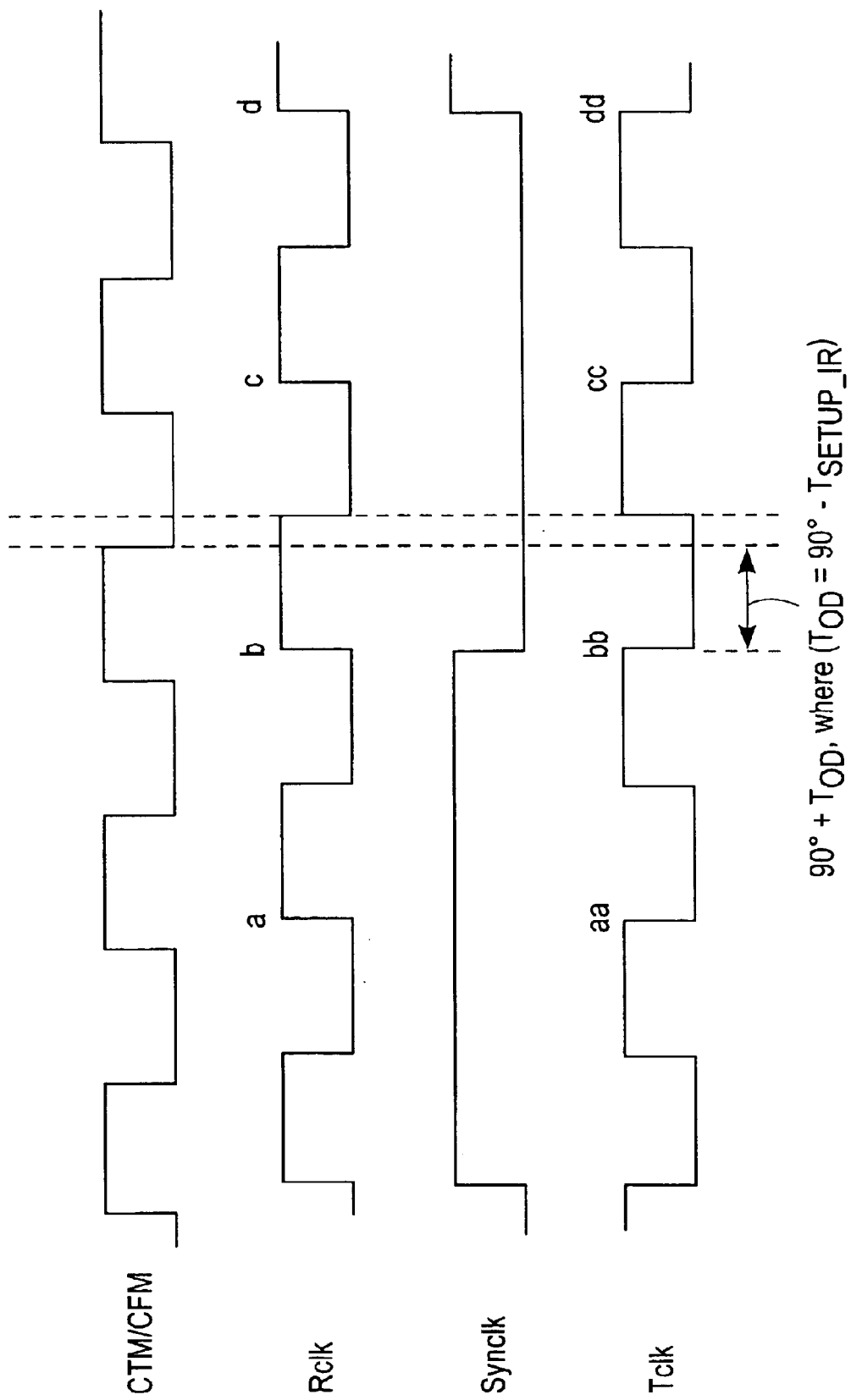
FIG. 6 is a timing diagram summarizing the ideal phase relationships between CTM/CFM, rclk, Synclk, and tclk.

With these desired relationships established, the application of the related clock signals to the devices in the bus system will now be examined. As can be understood from reference to system configuration illustrated in FIGS. 1A, the phase relationship between CTM and CFM as defined by the present invention is different at each slave device depending on its position along the channel. Thus, individual slave devices must contain a mechanism making allowance for this arbitrary phase relationship.

Figure 10:
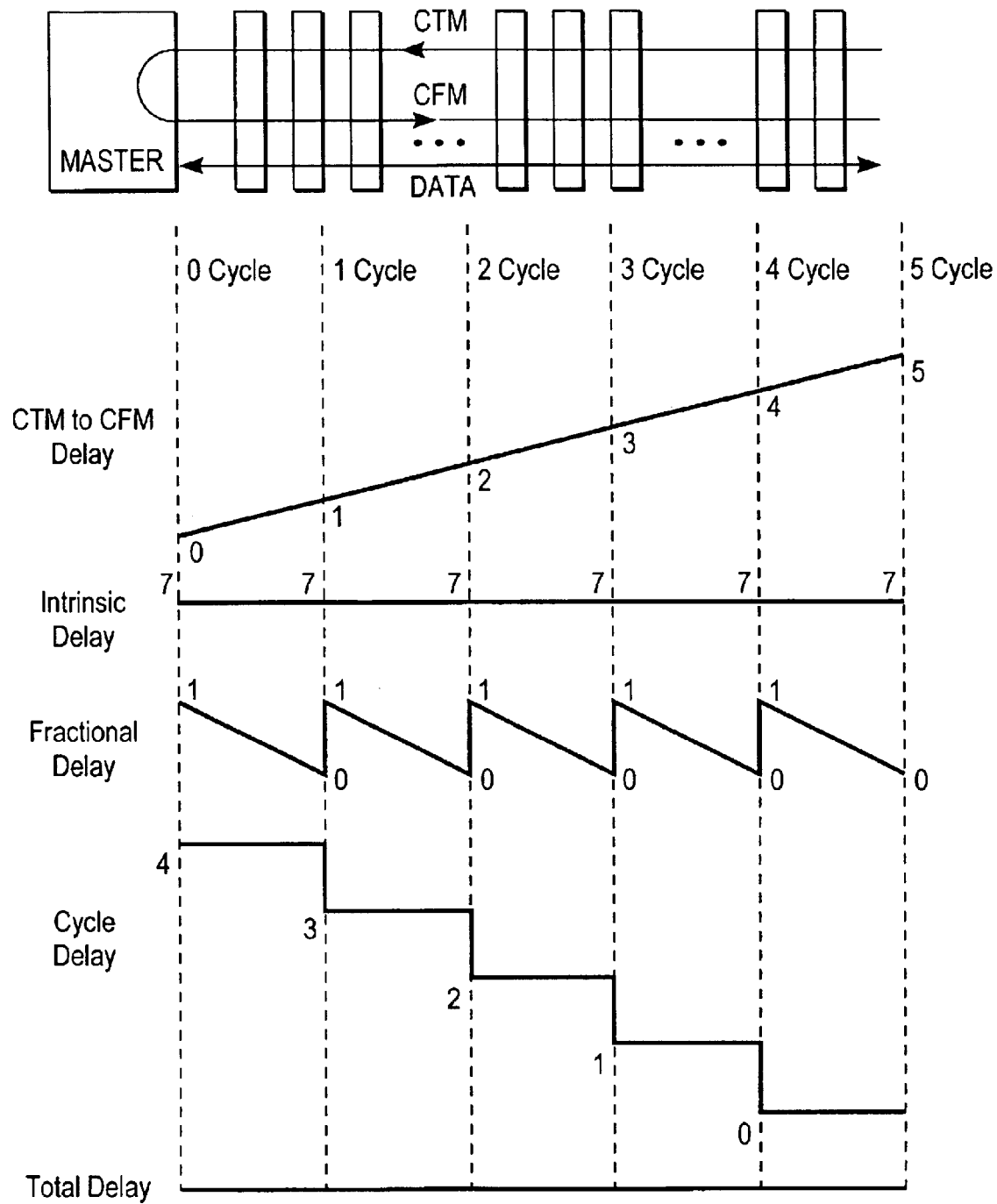
FIG. 10 conceptually illustrates the effect of channel length and slave device position along the channel to timing delay considerations inherent in the present invention.

FIG. 10 schematically illustrates this phenomenon. The delay between CFM and CTM at each slave device along the channel can be expressed as:

Total Delay=Intrinsic Delay+Cycle Delay+Fractional Delay.

Intrinsic delay is the time required to decode and execute an instruction at a slave device and does not vary between slave devices. For example, where the bus system is a memory system, intrinsic delay is the time required to decode an incoming "Read" request packet and fetch the desired data from memory.

Fractional delay is the extra delay that a slave device adds to the intrinsic delay such that the output of the desired data will be correctly aligned to the transmit clock (CTM). This delay linearly varies from zero when a slave device is near the upper end of a CTM/CFM cycle boundary to one cycle when a slave device is near the lower end of a CTM/CFM cycle boundary. As the CTM/CFM skew passes through a cycle boundary, the fractional delay value is reset to zero.

In the example illustrated in FIG. 10, five different cycle delay intervals are illustrated. However, a bus system may have any reasonable number of cycle delay intervals in accordance with its channel length, propagation speed, etc. No matter the actual size and configuration of the bus system, in order to maximize system bandwidth and minimize data bubbles on the channel, the master wants the apparent delay for each slave device to be constant. If the delay for each slave device consisted of only the intrinsic delay plus and the fractional delay, the master would "see" five different delays. For the example given in FIG. 10, this variable delay would range from zero to five for memory devices depending on the round trip distance on the bus between the master and each slave device. To avoid this problem, each slave device contains a programmable register which holds a cycle delay value corresponding to the number of additional cycles of delay added for each slave device. Again, with reference to the given example, the closest slave devices have an additional four clock cycles added by way of the register value. In contrast, the slave devices located farthest from the master have zero cycles of additional delay added. In this manner, each slave device presents the same apparent delay to the master.

Figure 11:
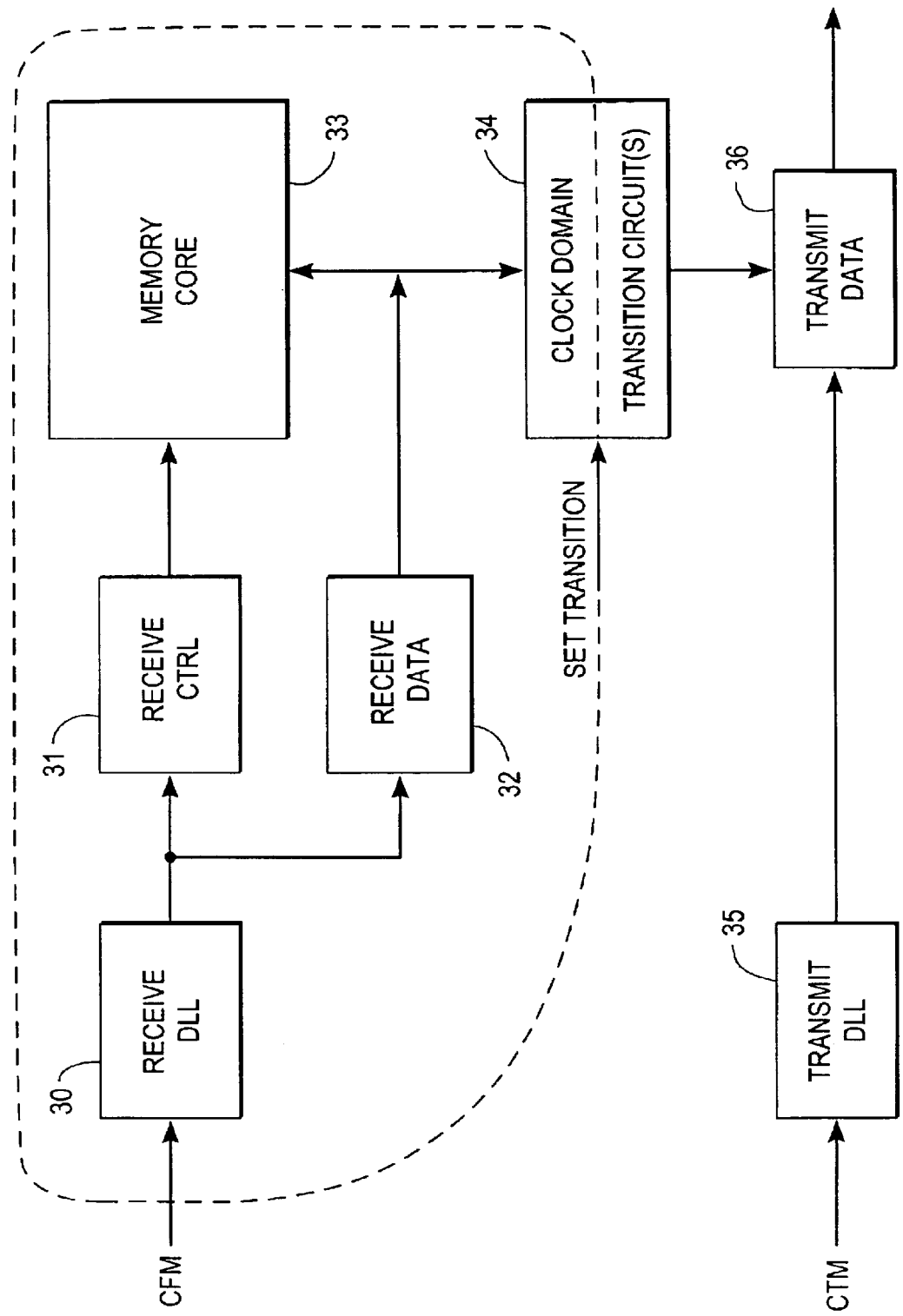
FIG. 11 conceptually illustrates the requirement for cross clock domain synchronization within a bus system, assuming a memory system as a specific example.

A detailed circuit capable of introducing the fractional delay noted above has previously been described in commonly assigned U.S. Pat. No. 6,473,439 the subject matter of which is incorporated herein by reference. Whatever circuit actually used to achieve the desired results above, the concept of cross clock domain transition (i.e., fractional delay adjustment between receive and transmit clock domains) is illustrated in FIG. 11. FIG. 11 assumes a memory system as a working example of the bus system described throughout.

In FIG. 11, two delay locked loops (DLLs) are used to track the incoming clock signals. That is, CFM is applied to receiver DLL 30 and CTM is applied to transmit DLL 35. By tracking both CFM and CTM, the circuit ensures that control information and data being sent from the master to the slave device are received (and stored) at the appropriate times and that data being sent from the slave device to the master is transmitted at the appropriate time. Data transmitted from the master to the slave device is conceptually separated from associated control information in blocks 31 and 32. Data transmission circuitry for sending data from memory core 33 in the slave device to the master is indicated by 36.

Since CTM and CFM can have any phase relationship, care must be taken when passing data from the received clock domain (indicated by the dotted line in FIG. 11) to the transmit clock domain. A clock domain transition circuit 34 performs this cross domain handoff.

In one preferred embodiment, the clock domain transition circuit 34 chooses between two different delay paths based on the relative phases of CTM and CFM, such that setup and hold requirements in the transmits data block 36 are not violated. The transitions between these two delay paths occur at the CTM/CFM phase intervals of n*tcycle and (n+0.5)*tcycle. The first of these transitions causes the fractional delay to reset from one to zero. The second transition is required for correct circuit operation, but is not externally visible.

In conventional bus systems, the phase difference between CTM and CFM at a given slave device did not change appreciably. Rather, it was fixed by the length of the trace between the master and the slave device, as well as the propagation delay through the master. Accordingly, conventional bus systems would only activate the "Self Transition" function once during system initialization. During Self Transition the correct fractional delay would be determined, and based on an observation of received data at the master, for example, the cycle delay register would be programmed, such that each slave device presented the same apparent delay.

In contrast, the CTM and CFM phase difference resulting from application of the concepts of the present invention will vary according to operating conditions, i.e., changes in $T_{OD}$ as a result of temperature, voltage etc. Thus, slave devices must be able to compensate for the changing phase relationship. There are a number of techniques which competently address this new requirement.

In a first technique, each slave device recalculates its fractional delay with sufficient frequency to effectively compensate for any variation in $T_{OD}$. This technique works well for bus systems whose total round trip is less than one cycle, because the update will require little controller overhead. However, systems exhibiting delays greater than one cycle are problematic because the apparent delay for slave devices near n*tcycle boundaries may change as the CFM to CTM phase relationship shifts. To compensate for this effect, the master would necessarily measure the delay for data arriving from each slave device following fractional delay adjustment, and reprogram, as necessary, the cycle delay register to maintain a constant apparent delay. Unfortunately, the overhead required to dynamically adjust both fractional and cycle delay components in this manner is prohibitive for many bus system applications.

Thus, in a preferred approach to this cycle boundary crossing problem, the slave device detects when it crosses a cycle delay boundary, and increments or decrements the cycle delay value in the cycle delay register accordingly. Such detection may be accomplished by noting when the fractional delay value goes back and forth across the 0 and 1 boundary.

In a second technique, sufficient margin is provided in the slave device CTM/CFM phase calibration circuitry to handle the $T_{OD}$ variation. Contemporary fractional delay circuits can automatically track up to 0.1*tcycles of CFM to CTM variation following operation of the Set Transition function. Further, variations in TOD may be significantly reduced by isolating the master (or master interface circuit) from environmental factors such as temperature and voltage.

Figure 12:
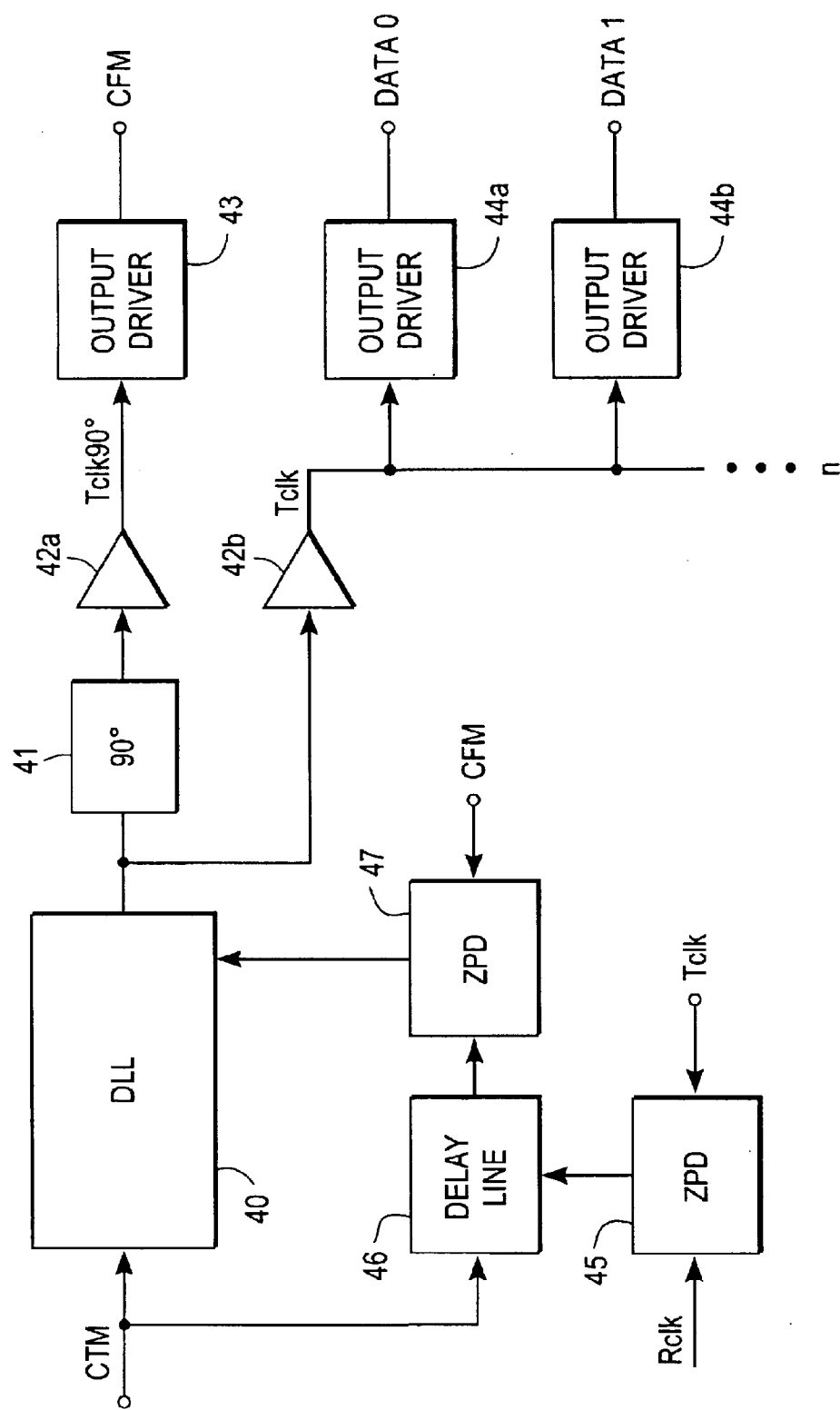
FIG. 12 is a diagram of another exemplary synchronization circuit.

A third technique is illustrated in FIG. 12. Within the exemplary circuit shown in FIG. 12, DLL 40 tries to align (CTM+delay) to CFM. During initial calibration, the delay amount is adjusted until rclk and tclk are 180° apart, i.e., their optimal phase relationship. Then the delay amount is held steady during an entire period of operation. The DLL will then maintain the relationship of (CTM+delay)=CFM, and will account for any variation in TOD by adjusting the phase of tclk. In effect, this technique shifts the timing problem due to TOD from CFM to tclk, thereby no longer ensuring the ideal relationship between tclk and rclk. However, tclk/rclk synchronization issues will be limited only to temperature and voltage variations since process variations may be compensated during the initial delay calibration. Recalibration may be performed on the basis of shifts in temperature and voltage.

More specifically, CTM is applied to DLL 40 and delay line 46. The output of DLL 40 is applied to 90° block 41 and output through buffer 42b as tclk. The output of 90° block 41 passes through buffer 42a as tclk 90° and an output driver circuit 43 as CFM. A first zero phase detector circuit 45 receives rclk and the complement of tclk as inputs and also drives delay line 46. The output of delay line 46 and CFM are input to a second ZPD 47 which drives DLL 40.

What is claimed is:

1. A method of aligning clock signals in a system comprising a master and one or more slave devices connected via a channel, the system further comprising a first system clock propagating towards the master and a second system clock propagating away from the master, wherein the first and second system clocks are initially phase aligned, the method comprising:
    generating a transmit clock signal in the master in relation to the first system clock;
    shifting the transmit clock signal phase by 90°; and
    passing the phase shifted transmit clock signal through an output driver circuit in the master to generate the second system clock, such that the first and second system clocks are no longer phase aligned.

2. The method of claim 1, further comprising:
    driving data onto the channel in accordance with the transmit clock signal; and
    wherein the step of passing the phase shifted transmit clock signal through an output driver circuit drives the second system clock onto the channel, such that the data and the second system clock are communicated to the one or more slave devices via the channel in a predefined phase relationship.

3. The method of claim 2, wherein the step of generating the transmit clock signal in the master further comprises:
    receiving the first system clock as a first input to a delay locked loop circuit;
    receiving a phase feedback signal as a second input to the delay locked loop circuit; and
    providing the output of the delay locked loop circuit as the transmit clock signal.

4. The method of claim 3, wherein the phase feedback signal is generated by phase comparing the complement of the transmit clock signal and a receive signal in a phase detector circuit.

5. The method of claim 3, wherein the phase feedback signal is generated by the output of a flip-flop circuit receiving the first clock as an input, wherein the flip-flop circuit is gated by the complement of the transmit clock signal.

6. A method of aligning system clocks in a system comprising a master and one or more slave devices connected via a channel, the master further comprising a receiver having a receiver setup time delay and an output driver having an output driver delay, the method comprising:
    generating a first system clock external to the master such that the first system clock propagates via the channel through the one or more slave towards the master; and
    in the master, generating a second system clock having a phase relationship to the first system clock defined such that, the phase difference between the first system clock and the second system clock is substantially equal to 90° minus the sum of the receiver setup delay and the output driver delay.

7. The method of claim 6, further comprising:
    modifying the second system clock to preserve the phase relationship in response to a change in the output driver delay.

8. A method of providing an apparent delay for data traversing a system, the system comprising a channel connecting a master and a plurality of slave devices, wherein data traverses the channel from the slave devices to the master in relation to a first system clock and wherein data traverses the channel from the master to the plurality of slave devices in relation to a second system clock, the method comprising:
    for each slave device, calculating a fractional delay and a cycle delay, such that the sum of the fractional delay and the cycle delay with an intrinsic delay and a clock phase delay equals the apparent delay;

modifying the second system clock in the master; and for each slave device, recalculating the fractional delay in accordance with the modified second system clock.

9. The method of claim 8, wherein the master further comprises a transmitter providing an output driver delay to data and control information signals sent from the master to the slave devices, wherein the second system clock is modified in accordance with a change in the output driver delay, and wherein the step of recalculating the fractional delay tracks out the change in the output driver delay.

10. The method of claim 8, further comprising:

for each slave device, following the recalculation of the fractional delay, recalculating the cycle delay.

11. The method of claim 10, wherein recalculating the cycle delay comprises:

determining whether recalculation of the fractional delay has resulted in the crossing of a cycle delay boundary.

12. A circuit for defining a second system clock in a system comprising a master connected to one or more slave devices via a channel, the channel communicating an externally generated first system clock towards the master, the circuit comprising:

a delay locked loop circuit configured to receive the first system clock and a phase feedback signal as inputs and to generate a transmit clock signal;

a 90° block configured to receive the transmit system clock and to generate a 90° phased shifted version of the transmit clock signal; and an output driver circuit configured to receive the 90° phased shifted version of the transmit clock signal and to generate the second system clock.

13. The circuit of claim 12, further comprising:

a zero degree phase detector configured to receive a receive clock signal and a complement of the transmit clock signal as inputs and to generate the phase feedback signal.

14. The circuit of claim 12, further comprising:

a flip-flop circuit configured to receive the first system clock as an input and receiving a complement of the transmit clock signal as a gating signal and to generate the phase feedback signal.

15. The circuit of claim 12, further comprising a plurality of data output drivers connected to the channel and enabled by the transmit clock signal.

16. The circuit of claim 12, further comprising a plurality of data output drivers connected to the channel and enabled by a complement to a receive clock signal.

17. A method of aligning clock signals in a system comprising a master and one or more slave devices connected via a channel, the system further comprising a first system clock propagating towards the master and a second system clock propagating away from the master, the method comprising:

initially generating a transmit clock signal in the master;

initially generating a receive clock signal in the master, wherein the receive clock is substantially complementary to the transmit clock;

initially calibrating a delay in relation to a phase relationship between the receive clock and the transmit clock; and defining the second system clock in relation to the first system clock and the calibrated delay.

18. A circuit defining a second system clock in a system comprising a master connected to one or more slave devices via a channel, the channel communicating an externally generated first system clock towards the master, the circuit comprising:

a delay locked loop circuit configured to receive the first system clock and a second phase feedback signal as inputs and to generate a transmit clock signal;

a 90° block configured to receive the transmit system clock and to generate a 90° phased shifted version of the transmit clock signal;

an output driver circuit configured to receive the 90° phased shifted version of the transmit clock signal and to generate the second system clock;

a first phase detector configured to receive a receive system clock and the transmit system clock and to generate a first phase feedback signal;

a delay element configured to receive the first system clock and the first phase feedback signal and to generate a delayed first system clock; and a second phase detector configured to receive the delayed first system clock and the second system clock and to generate the second phase feedback signal.

* * * * *